United States Patent [19]
Hirata et al.

[11] Patent Number: 5,691,038
[45] Date of Patent: Nov. 25, 1997

[54] COVER TAPE AND COATING APPLICATOR

[75] Inventors: Akira Hirata; Mikio Komiyama; Katsuhisa Taguchi, all of Urawa; Takanori Saitoh, Misato, all of Japan

[73] Assignee: Lintec Corporation, Tokyo, Japan

[21] Appl. No.: 361,362

[22] Filed: Dec. 21, 1994

[30] Foreign Application Priority Data

Dec. 22, 1993 [JP] Japan ................... 5-068644 U
Oct. 18, 1994 [JP] Japan ................... 6-252465

[51] Int. Cl.⁶ .................... C09J 7/02; B32B 7/12
[52] U.S. Cl. .................... 428/194; 428/343; 428/354; 428/355 AC
[58] Field of Search .................... 428/194, 195, 428/343, 354, 355

[56] References Cited

U.S. PATENT DOCUMENTS

| | | | |
|---|---|---|---|
| 4,929,486 | 5/1990 | Itou et al. | 428/354 X |
| 4,963,405 | 10/1990 | Yamashita et al. | 428/355 X |
| 5,054,618 | 10/1991 | Kim | 206/605 |
| 5,149,586 | 9/1992 | Ishiwata et al. | 428/354 X |
| 5,208,103 | 5/1993 | Miyamoto et al. | 428/355 X |
| 5,346,765 | 9/1994 | Maeda et al. | 428/355 X |
| 5,441,809 | 8/1995 | Akhter | 428/354 |
| 5,500,294 | 3/1996 | Sakumoto et al. | 428/355 |

*Primary Examiner*—Daniel Zirker
*Attorney, Agent, or Firm*—Webb Ziesenheim Bruening Logsdon Orkin & Hanson, P.C.

[57] ABSTRACT

The present invention provides a cover tape comprising a tapelike base material 1, adhesive parts 2 formed on one side of the base material 1 at both edges along the longitudinal direction thereof, and a nonadhesive resin part 3 formed between the adhesive parts 2 and having substantially the same thickness as that of the adhesive parts 2. This cover tape is used to collectively pack chips and other small items while keeping them separate from each other to thereby permit the storage, transportation and automatic takeout thereof, which cover tape can be rendered very long. Further, the present invention provides a coating applicator suitable for use in the production of the above cover tape.

22 Claims, 11 Drawing Sheets

5,691,038

COVER TAPE AND COATING APPLICATOR

FIELD OF THE INVENTION

One aspect of the present invention relates to a cover tape for sealing a carrier tape employed for collectively packing small electronic components such as semiconductor chips, resistors and capacitors, small mechanical parts such as bolts and nuts or small articles such as tablets (hereinafter collectively referred to as "chips and other small items") while keeping them separate from each other to thereby permit the storage, transportation and automatic takeout thereof.

Further, the present invention relates to a coating applicator suitable for use in the production of the above cover tape. That is, another aspect of the present invention relates to a coating applicator provided with discharge nozzles adapted to discharge through the tips thereof a coating material such as an adhesive or a nonadhesive resin onto a base material continuously fed at a constant rate so that the coating material is linearly applied on one side of the base material.

BACKGROUND OF THE INVENTION

In recent years, electronic parts such as resistors, capacitors and integrated circuits (IC) are increasingly miniaturized, and the use of chips is being rapidly promoted. Accordingly, various methods have been proposed for the storage, transportation and automatic takeout of chips and other small items. Among them, the tape carrier method is deemed the most promising.

The conventional tape carrier methods are divided into a method in which a base material having through holes is used as the carrier tape and another method in which a base material having recess portions is used as the carrier tape.

The method in which the carrier tape having through holes is used comprises providing a carrier tape of thick strip paper or the like with a vast plurality of through holes as accommodation parts at fixed intervals by punching and other means, separately disposing a vast plurality of feed holes, sticking a bottom tape onto one side of the carrier tape, placing chips and other small items in the accommodation parts, and laminating a cover tape onto the other side of the carrier tape.

In the method in which a base material having recess portions is employed as the carrier tape, use is made of a carrier tape comprising a strip plastic tape provided with a vast plurality of recess portions as accommodation parts disposed at fixed intervals and further provided with feed holes. Chips and other small items are placed in the accommodation parts, followed by lamination of a cover tape thereto for sealing.

Both of the above methods utilize a cover tape. The conventional cover tape comprises a tapelike base material having its one side entirely coated with an adhesive. However, when this cover tape is employed, the control of adhesion is difficult and there has been the danger that the accommodated chips and other small items adhere to the adhesive of the cover tape, depending on the environment during the transportation thereof, to thereby soil the chips and other small items.

Therefore, various techniques have been developed and proposed for realizing the adhesion only at parts for sticking the cover tape to the carrier tape while avoiding the adhesion at parts opposing to the parts for accommodating chips and other small items, as follows.

In one example of such techniques (1st technique), a nonadhesive tape is stuck to parts opposing to the parts for accommodating chips and other small items after the application of an adhesive (see FIG. 18).

In another example of such techniques (2nd technique), a nonadhesive resin is applied to parts opposing to the parts for accommodating chips and other small items, and cured, after the application of an adhesive (see FIG. 19).

In a further example of such techniques (3rd technique), a heat-sensitive adhesive is applied, and only both edges along the longitudinal direction of each of a carrier tape and a cover tape are heated to thereby effect sticking thereof.

However, the above 1st and 2nd techniques have drawbacks in that an additional step of sticking a nonadhesive tape or of applying and curing a nonadhesive resin is required, and that, in the 2nd technique, application of a strong external force to the cover tape leads to destruction of the formed nonadhesive layer.

The 3rd technique is disadvantageous in that there is the danger that, when the cover tape stuck to the carrier tape is stored or transported at high temperatures, the adhesive is activated to thereby cause the chips and other small items to adhere to the adhesive layer, so that the chips and other small items are soiled.

The use of a cover tape (see FIG. 20) having an adhesive applied on only parts thereof to be stuck to the carrier tape (known as rib coating) would be considered for overcoming the above drawbacks of the prior art. However, there is a thickness difference between the parts where an adhesive layer is formed and the parts where no adhesive layer is formed on the above cover tape, thereby making it difficult to uniformly wind the cover tape in a roll form. If winding were effected, there would occur problems such as winding failure during the transportation or use of the cover tape, and the customary winding method could not provide a roll having large length, thereby necessitating winding take-up of the cover tape by traverse winding (twill winding).

Extensive and intensive studies have been made with a view toward solving the above problems. As a result, a conception has been developed of providing the center of one side of a base material with a nonadhesive layer and disposing adhesive layers at both edges of the base material so that the thicknesses of the nonadhesive layer and the adhesive layers are substantially the same. The present invention has been completed on the basis of this conception.

The nonadhesive layer and the adhesive layer as mentioned above are formed by applying appropriate resins onto a base material by means of a coating applicator.

In order to partially coat (rib coating) two or more coating materials onto one surface of the base material, there were conventionally used a rotary screen printer or a coating applicator in which a coater head is provided with a knife for scraping the coating materials. However, by these coating machines, each of the coating materials should be coated independently step by step, and hence, the number of steps and machining cost are increased. Further, it was required to coincide the accuracy of coating patterns.

Furthermore, for partially coating two or more of coating materials by a single step, there was used a coating applicator in which discharge nozzles whose diameter and arrangement are adjusted to the shape of coating patterns are opposed to one surface of the base material.

The above discharge nozzles generally each have a circular cross section.

The coating material is discharged through the discharge nozzle onto a base material continuously fed at a constant rate, so that the coating material is applied linearly with a predetermined width along the longitudinal direction on one side of the base material.

However, when a coating material is linearly applied onto one side of a base material through a discharge nozzle having a circular cross section as in the above prior art, the amount of the discharge at the center of the discharge nozzle is greater than that at the periphery thereof, so that a coating film having a pointed (not flat) cross section whose central portion is heaped is formed, with the result that the thickness of the coating film varies along the width direction thereof. Therefore, when the coating film is used as, for example, an adhesive layer, the adhesion is effected at only the apex of the adhesive, so that the bonding strength is poor. Such problems were not present in the above mentioned multi-steps coating method.

For supplying the coating materials in the above mentioned discharge nozzle method, there is known a pressure tank method in which a coating material accommodated in a pressure tank is directly pressurized to thereby cause the coating material to be fed under pressure through a hose to a discharge nozzle. Another well known form of the conventional coating applicator employs a compression pump method in which a compressed-air-driving-type plunger pump or the like sucks a coating material and feeds the same through a hose to a discharge nozzle under pressure.

However, when a coating material is fed under pressure to a discharge nozzle by means of a compressed-air-driving-type plunger pump or the like, it is difficult to maintain the discharge pressure at a fixed value due to, for example, the relationship with the solvent contained within the coating material. Therefore, application of the coating material over a length of, for example, several hundreds or thousands of meters is inevitably accompanied by waving of the thickness of the coating film along the longitudinal direction thereof.

For the above reason, for example, the current situation has been such that it is difficult to meet the requirement for the above cover tape of not only imparting satisfactory bonding strength to the adhesive layer but also controlling the adhesive layer and the nonadhesive resin layer to have respective uniform thicknesses (flat) along the width direction thereof so as to cause the thicknesses of the layers to be substantially the same throughout the entire length along the longitudinal direction of the base material.

It has been confirmed that, for example, a cover tape for a carrier prepared by a method comprising the steps of applying a nonadhesive resin (polyester resin) onto one side of a base material with the use of a coating applicator having blades conformed to the shape of a nonadhesive resin coating mounted on the tips of a comma roll to obtain 5.3 mm wide layers at 4.0 mm intervals, drying the layers, forming 20 μm thick adhesive layers (acrylic adhesive having a concentration of 35% and a viscosity of 1000 cps) on interstices not coated with the nonadhesive resin on the nonadhesive-resin-coated surface of the base material through circular discharge nozzles having a diameter of 1.6 mm and cutting each of the adhesive layers at the center along the width direction thereof with a cutter to thereby obtain tapes each having adhesive layers on both edges thereof, has a bonding strength of 5 g only, this value falling outside the EIAJ standard (10 to 70 g) to thereby show the unattainability of stable bonding strength.

The present invention has been made in view of the above prior art, and an object of the present invention is to provide a cover tape employed for collectively packing chips and other small items while keeping them separate from each other to thereby permit the storage, transportation and automatic takeout thereof, which cover tape can be rendered very long. Another object of the present invention is to provide a coating applicator adapted to apply a coating material so that the resulting coating film is flat and has a uniform thickness along the width direction of a base material, which thickness is also uniform throughout the entire length along the longitudinal direction of the base material.

SUMMARY OF THE INVENTION

The cover tape of the present invention is adhered to a surface of a carrier tape having a tape shape and having accommodation parts for accommodating chips and other small items formed discontinuously along the longitudinal direction of the tape to thereby seal the accommodation parts, which comprises:

a tapelike base material, adhesive parts formed on one side of the base material at both edges along the longitudinal direction thereof so as to oppose to none of the accommodation parts, and a nonadhesive resin part formed between the adhesive parts, opposing to the accommodation parts and having substantially the same thickness as that of the adhesive parts.

The desired cover tape employed for collectively packing chips and other small items while keeping them separate from each other to thereby permit the storage, transportation and automatic takeout thereof, which cover tape can be rendered very long, can be provided by virtue of the above feature of the present invention.

Further, the coating applicator of the present invention is provided with a discharge nozzle adapted to discharge a coating material onto a base material continuously fed at a constant rate so that the coating material is linearly applied on one side of the base material, wherein the discharge nozzle has a tip flatly formed so as to have a major axis in the width direction orthogonal to the feeding direction of the base material, and which is adapted to discharge the coating material through the discharge nozzle in accordance with the rotation of a displacement-type rotary pump.

In the present invention, the coating applicator may be adapted to apply at least two types of coating materials, and may be provided with a discharge nozzle adapted to discharge at least one type of coating material and having a tip flatly formed so as to have a major axis in the width direction orthogonal to the feeding direction of the base material. Further, the coating applicator of the present invention may be provided with a plurality of discharge nozzles adapted to apply at least two types of coating materials, these discharge nozzles being arranged in a single or a plurality of rows along the direction of the width of the base material and collectively held while maintaining the arrangement. Still further, in the coating applicator of the present invention, a multiple gear pump may be used as the displacement-type rotary pump.

The above structured coating applicator of the present invention is capable of discharging a coating material through a discharge nozzle onto a base material more uniformly so that the discharged coating material is expanded in the width direction of the base material. Further, the coating applicator is capable of continuously feeding the coating material to the discharge nozzle by means of a displacement-type rotary pump such as a gear pump while keeping the discharge pressure of the pump more uniform. Therefore, in the use of the coating applicator of the present invention, the change of the thickness of the coating film along the width and longitudinal directions of the base material can be prevented to thereby ensure an improved uniformity of the thickness of the coating film.

For example, when an adhesive and a nonadhesive resin are alternately applied, the adhesive layer can be rendered more flat to thereby have a stable bonding strength by flatly shaping the tip of at least the discharge nozzle for applying the adhesive so as to have a major axis in the width direction orthogonal to the feeding direction of the base material.

Moreover, for example, when two or more types of coating materials are separately applied on one side of a base material, the dimensional accuracy of the coating film along the width direction of the base material can be improved by arranging a plurality of discharge nozzles in a single row along the direction of the width of the base material and collectively holding them while maintaining the arrangement to thereby perpetually keep the interdischarge-nozzle spacing constant.

DETAILED DESCRIPTION OF THE INVENTION

Hereinbelow, the cover tape and the coating applicator according to the present invention will be described in greater detail referring to the appended drawings.

First, the cover tape will be described.

The cover tape of the present invention is adhered to a surface of a carrier tape having a tape shape and having accommodation parts for accommodating chips and other small items formed discontinuously along the longitudinal direction of the tape to thereby serve the sealing of the accommodation parts.

Figure 1:
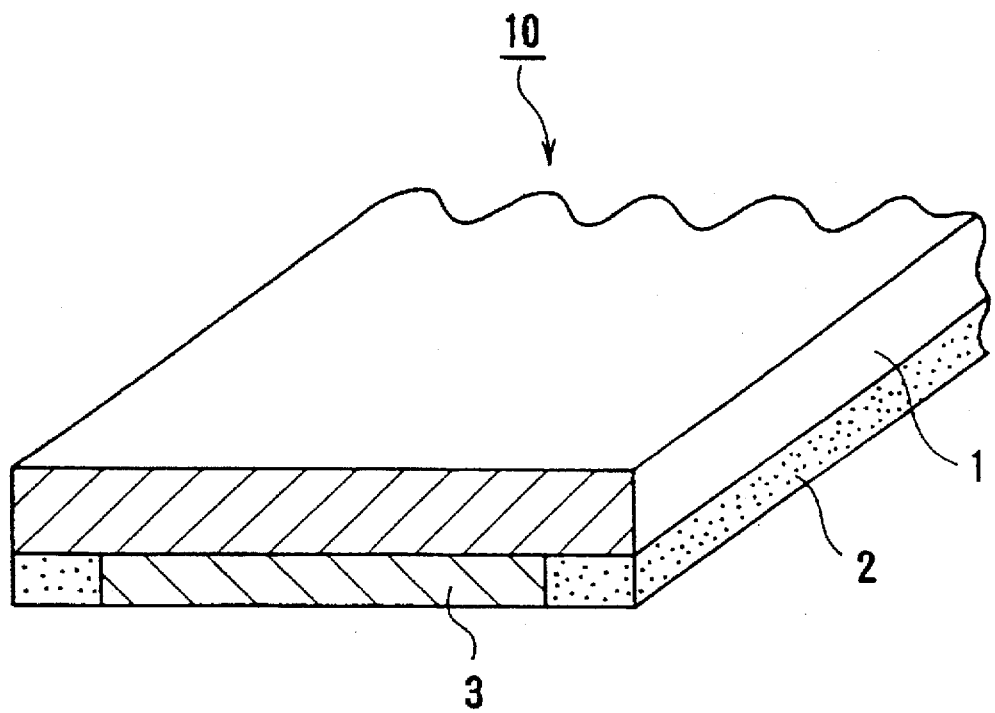
FIGS. 1, 2 and 7 are each a partial sectional perspective view of one embodiment of the cover tape of the present invention.
Figure 8:
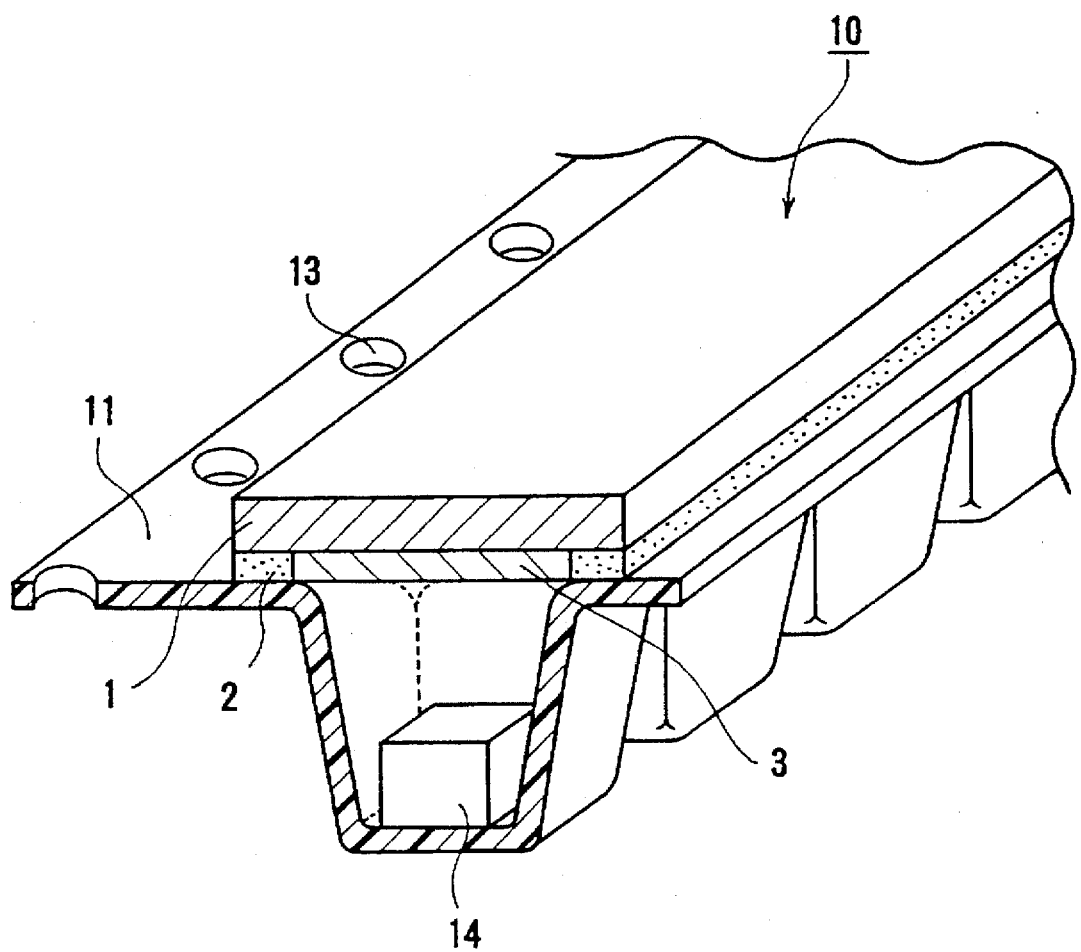
FIGS. 8 and 9 are each a partial sectional perspective view of a cover tape showing the condition of the use thereof.
Figure 9:
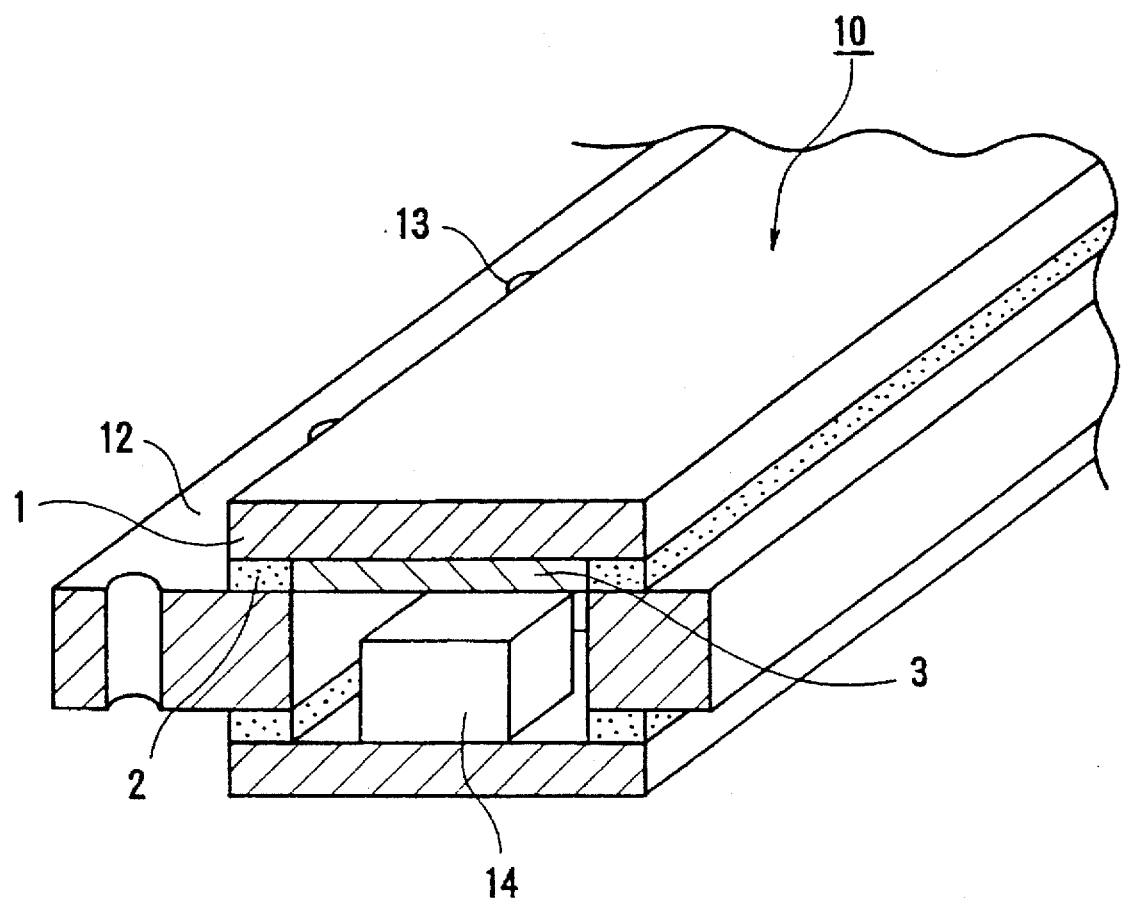

As shown in FIG. 1, the cover tape 10 of the present invention comprises a tapelike base material 1, adhesive parts 2 formed on one side (side that opposes chips and other small items 14) of the base material 1 at both edges along the longitudinal direction thereof, and a nonadhesive resin part 3 formed between the adhesive parts 2. The adhesive parts 2 are formed so as to oppose none of the accommodation parts for accommodating chips and other small items 14, as shown in FIGS. 8 and 9. The nonadhesive resin part 3 is formed so as to oppose the accommodation parts for accommodating chips and other small items 14, and has substantially the same thickness as that of the adhesive parts 2.

It is preferred that the tapelike base material 1 be transparent. The employment of the transparent base material facilitates discrimination of the accommodated chips and other small items 14, thereby reducing mounting errors.

The base material 1 may be composed of various synthetic resins. Preferred examples of the synthetic resins include oriented polyethylene terephthalate (PET), oriented polypropylene (PP), oriented polyamides, oriented polyvinyl chloride (PVC), polystyrene, polycarbonate, polyethylene and polyacrylonitrile. The base material 1 has a thickness of generally from 6 to 200 μm, preferably from 10 to 100 μm.

An antistatic agent may be applied by coating onto or kneaded into the base material 1.

The adhesive exhibits a high level of peeling charge, thereby occasionally degrading the reliability of electronic components. The treatment with the antistatic agent can prevent the damaging of electronic components by static electricity. Examples of the antistatic agents include carbon, metals and cationic, anionic and nonionic antistatic agents.

The adhesive parts 2 are formed on one side, namely the side that opposes the accommodated chips and other small items 14, of the above base material 1 at both edges along the longitudinal direction thereof. The cover tape 10 of the present invention is adhered for use to a carrier tape (11, 12) as shown in FIGS. 8 and 9. The formation of the adhesive parts 2 on one side of the base material 1 at both edges along the longitudinal direction thereof is performed in a manner such that no adhesive is present in the area of the surface of the base material 1 opposite to the accommodation part for chips and other small items 14 of the carrier tape (11, 12) when the cover tape has been adhered to the carrier tape (11, 12). For example, when the carrier tape (11, 12) has a total width of 8 mm, the accommodation part for chips and other small items 14 has a width of 4 mm and the cover tape 10 has a width of 6 mm, adhesive parts 2 each having a width of 1 mm or less are formed on both edges along the longitudinal direction of the cover tape 10. Although the thickness of the adhesive parts 2 is not particularly limited, it is preferably in the range of about 5 to 50 μm, still preferably 10 to 30 μm.

The adhesive parts 2 may be composed of various types of adhesives, such as acrylic, rubber and silicone adhesives.

The adhesive for forming the adhesive parts 2 may be compounded with colorants such as a dye, a pigment or a color former to thereby color the adhesive parts 2. Suitable colorants are, for example, carbon black, organic pigments, inorganic pigments, organic dyes and leuco dyes. These colorants are added in an amount of about 0.1 to 100 parts by weight per 100 parts by weight of adhesive.

The adhesive parts 2 may be colored by first coloring a site of the front or back of a base material 1 onto which an adhesive is to be applied, by printing or coating, and then applying the adhesive on the print or coating layer or its opposite side.

When the adhesive parts 2 are colored, the dislocation of the cover tape 10 can be sensed by monitoring the displacement of the adhesive parts 2. This stabilizes the operation of adhering of the cover tape.

The nonadhesive resin part 3 is formed between the adhesive parts 2 formed on both edges of the base material 1 along the longitudinal direction thereof.

The nonadhesive resin part 3 may be composed of a nonadhesive resin selected from among nonadhesive polyester resins, acrylic resins, urethane resins, rubbers and mixtures thereof. Among these, it is advantageous to employ a flexible and cushioning material selected from among natural rubber, styrene rubbers, isoprene rubbers, urethane rubbers, silicone rubbers, styrene foams, urethane foams, asphalt and mixtures thereof, from the viewpoint that the breakage of chips and other small items can be prevented during the transportation thereof. This breakage preventing effect can be improved by forming the accommodation part of the carrier tape (11, 12) with the use of the above materials.

The thickness of the nonadhesive resin part 3 is substantially the same as that of the adhesive parts 2. That is, providing that a, b and c respectively represent the thickness of the base material 1, the thickness of the adhesive parts 2 and the thickness of the nonadhesive resin part 3, the value determined by the formula:

$$\frac{(a+b)}{(a+c)} \times 100(\%)$$

is in the range of 100±20(%), preferably 100±10(%), still preferably 100±5(%).

Figure 2:
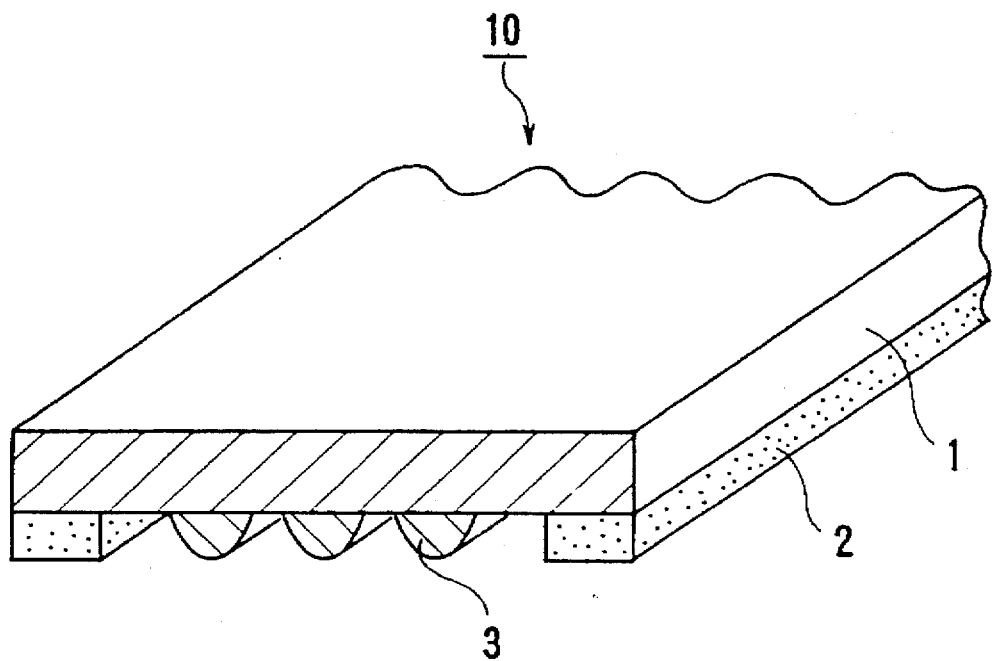
Figure 3:
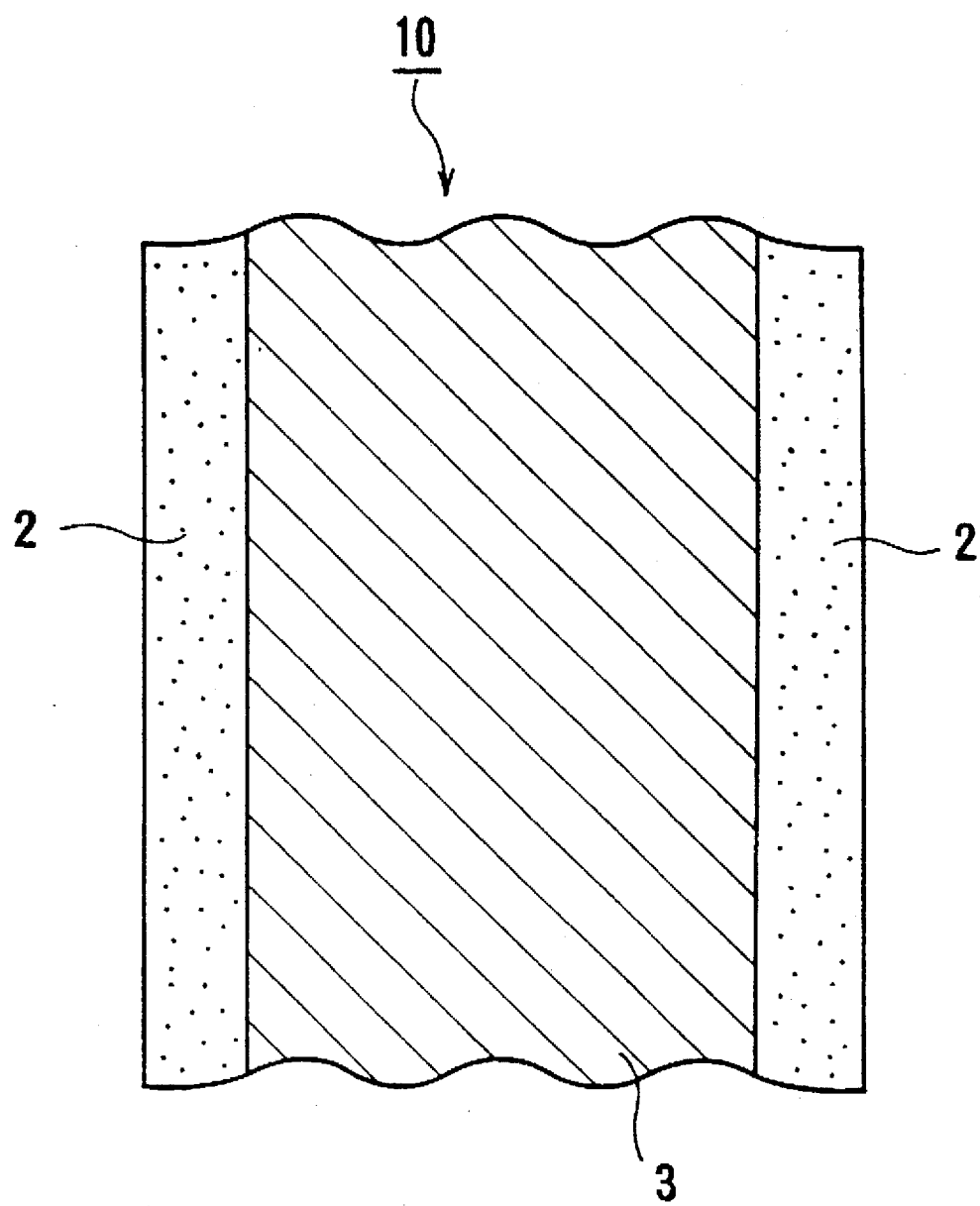
FIGS. 3 to 6 are each a view of the cover tape of the present invention observed from downward, showing the shape of a nonadhesive resin layer.
Figure 4:
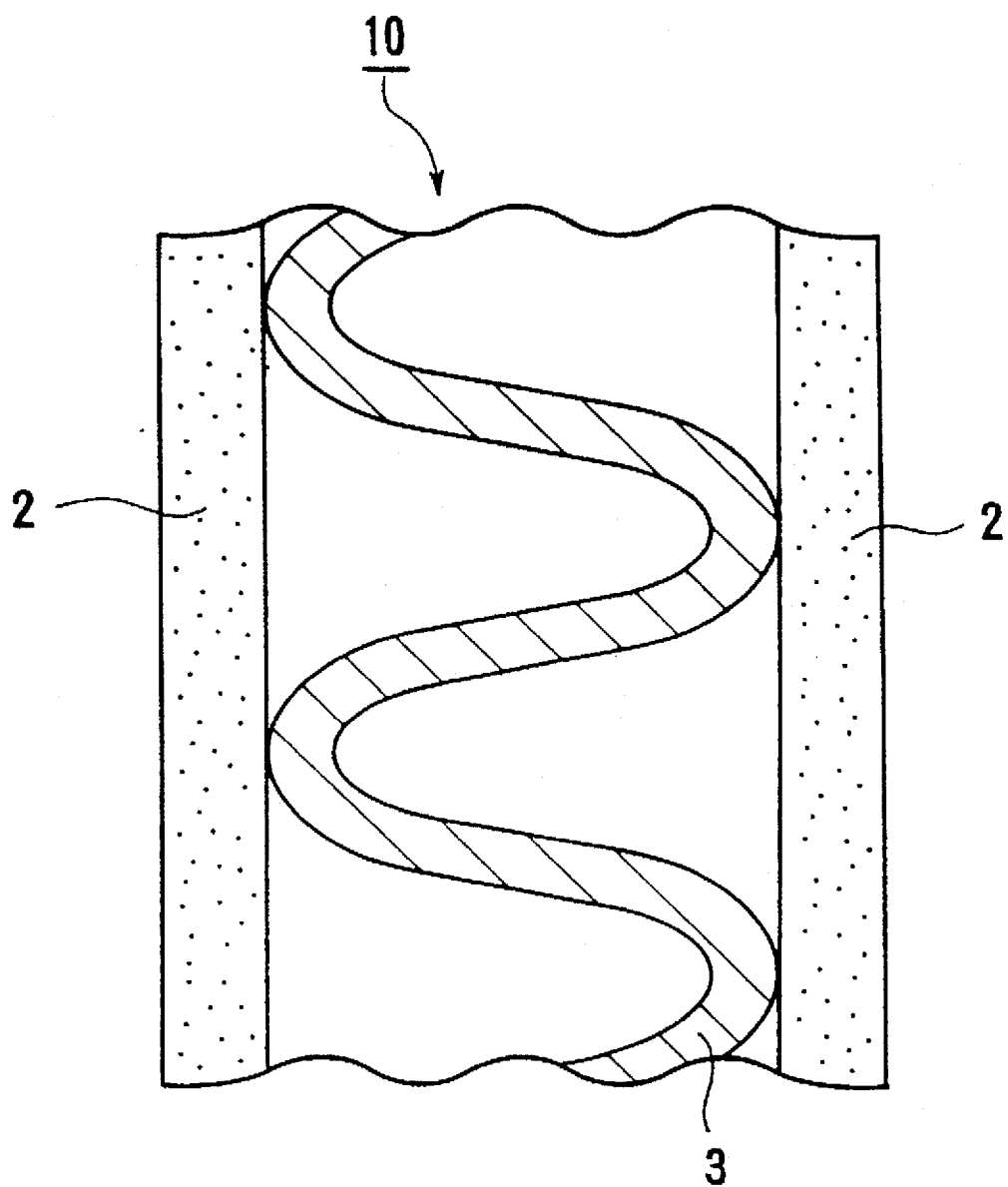
Figure 5:
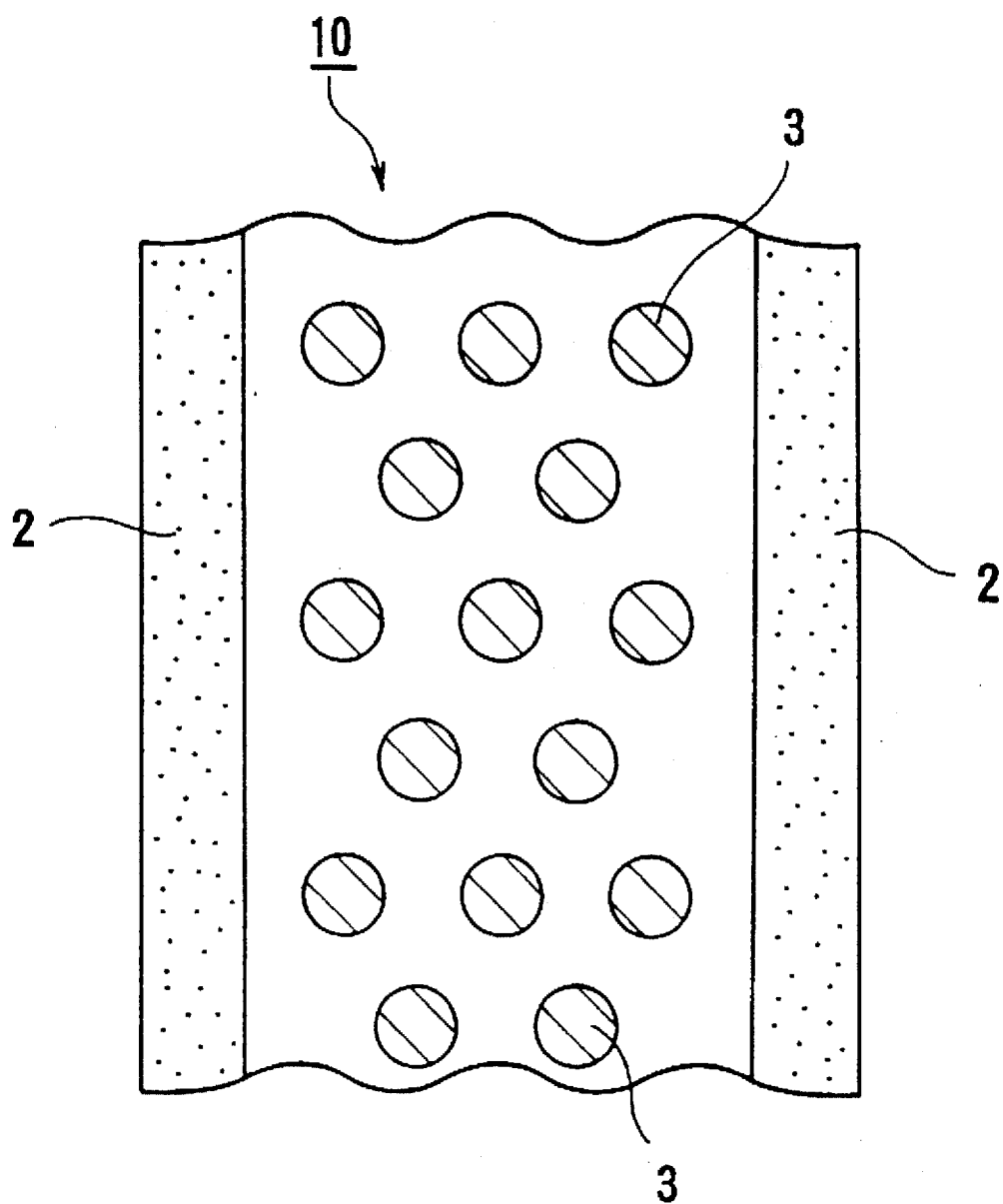
Figure 6:
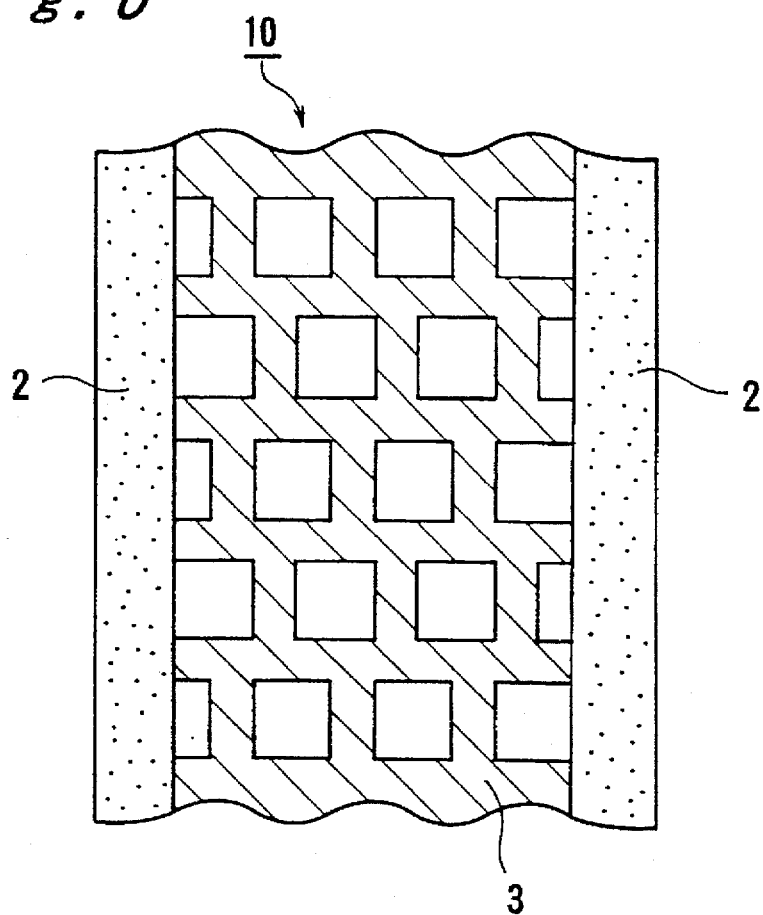

The nonadhesive resin part 3 may either be formed over the entire space between the adhesive parts 2 as shown in FIGS. 1 and 3, or on partial portions of the space as shown in FIG. 2. When the nonadhesive resin part 3 is formed on partial portions of the space between the adhesive parts 2, the shape thereof is not particularly limited. For example, the nonadhesive resin part 3 may have the shape of continued "S" characters as shown in FIG. 4, or dispersed dots as shown in FIG. 5, or a lattice as shown in FIG. 6.

The nonadhesive resin part 3 may be provided with antistatic treatment in the same manner as mentioned above.

Further, the nonadhesive resin part 3 may be provided with the same coloring as effected for the above adhesive parts 2.

The formed nonadhesive resin part 3 countervails the nonuniformity of the thickness along the width direction of the cover tape 10, namely, the difference in level between the zone where the adhesive parts 2 are formed and the zone where the adhesive parts 2 are not formed. Consequently, winding of the cover tape 10 is facilitated, and, when the winding is conducted in a roll form, the length thereof can be very large. For example, the rolled cover tape 10 can have a length as large as 1000 m or more.

Figure 7:
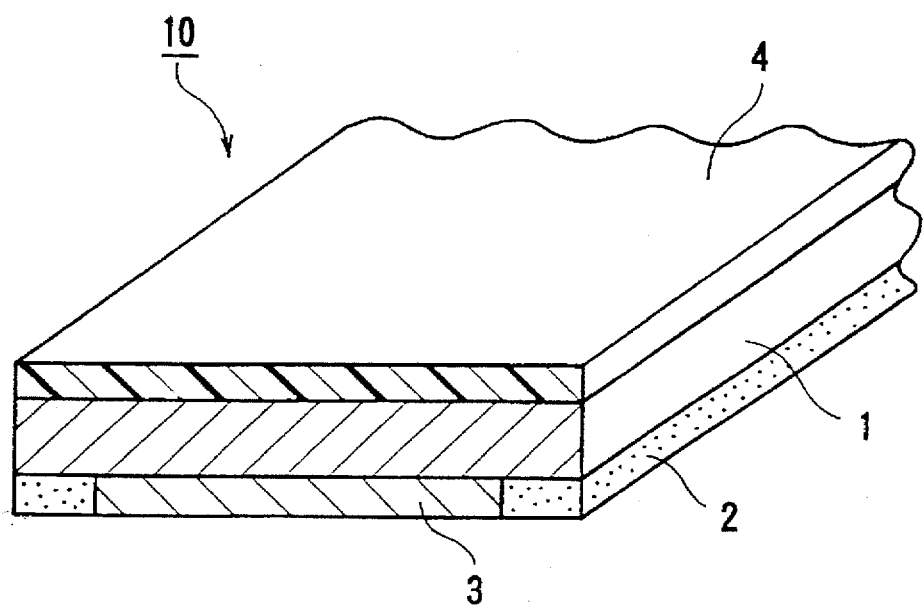

Further, the cover tape 10 of the present invention may have a release layer 4 superimposed on the upper surface of the base material 1 as shown in FIG. 7. The release layer 4 may be composed of a resin selected from among silicone, fluorinated and long-chain alkyl resins. The release layer 4 may also be provided with antistatic treatment in the same manner as mentioned above.

Below, the coating applicator of the present invention will be described.

FIGS. 10 to 13 show one embodiment of the coating applicator of the present invention, which may most suitably be employed for applying two types of coating materials on one side of a base material alternately along the width direction of the base material so that an adhesive layer and a nonadhesive resin layer having substantially the same thickness are formed linearly along the longitudinal direction of the base material.

Figure 10:
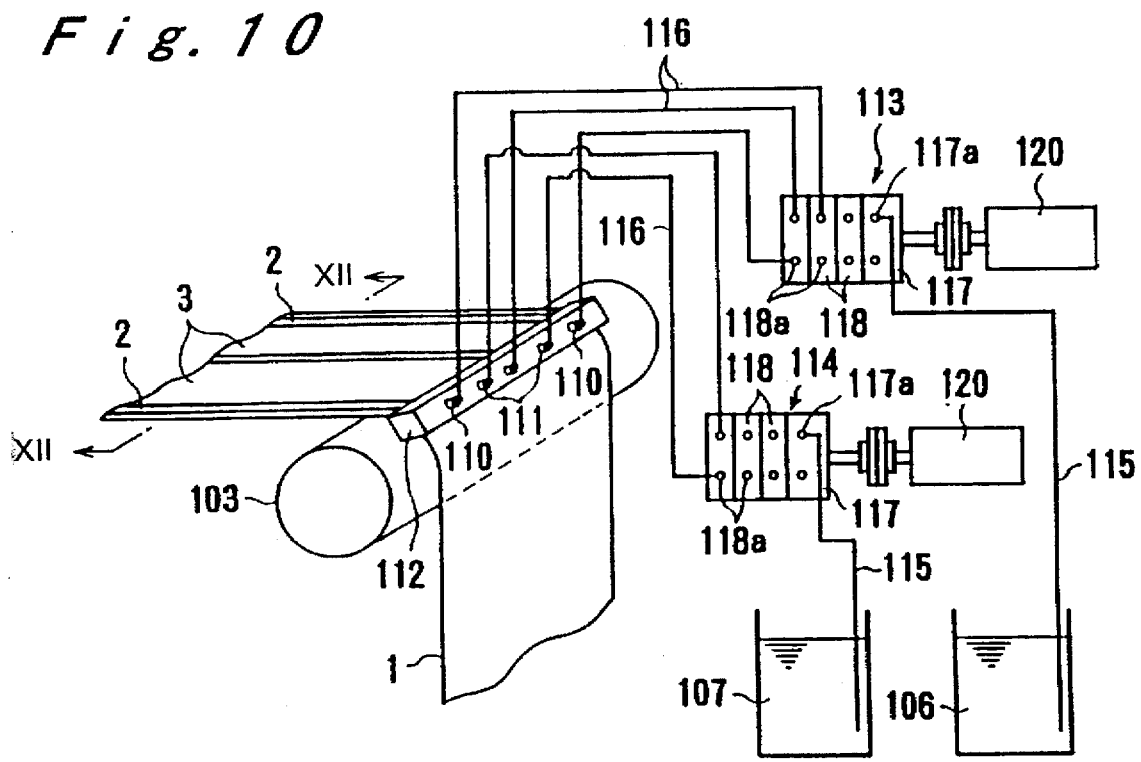
FIGS. 10 and 11 are respectively partial and entire perspective diagrams of one embodiment of the coating applicator of the present invention.
Figure 11:
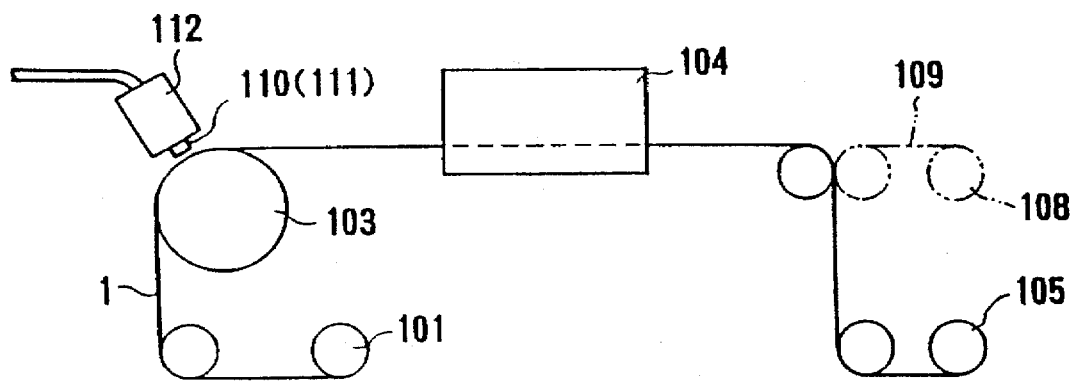
Figure 12:
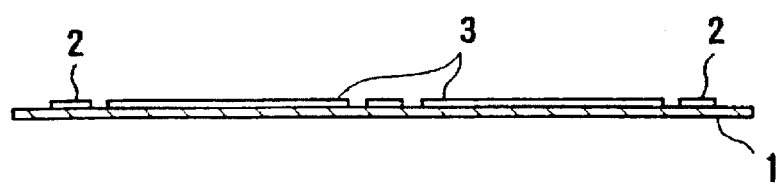
FIG. 12 is a section on the line A—A of FIG. 10.

That is, referring to FIGS. 10 to 12, a tapelike base material 1 wound around an unwinder 101 is continuously conveyed at a constant rate in accordance with the rotation of a backup roll 103, passes through the inside of a drier 104 and is wound around a rewinder 105. While the base material 1 is conveyed, a plurality of adhesive layers 2 and nonadhesive resin layers 3 sandwiched between neighboring adhesive layers 2 are simultaneously formed on one side of the base material 1.

In the shown embodiment of the coating applicator, use is made of a base material 1 having its back provided with release treatment, so that not only the side provided with release treatment is positioned on the surface side to thereby prevent exposures of the adhesive layers 2 and the nonadhesive resin layers 3 when the base material 1 is wound around the rewinder 105 but also the base material 1 is easily released for use. Instead, however, while laminating a release sheet 109 wound around an unwinder 108 onto the coating side of the base material 1, the base material 1 may be wound around a rewinder 105, as shown in FIG. 11 by an alternate long and two short dashes line.

The adhesive layers 2 are formed by discharging a coating material 106 containing an adhesive through first discharge nozzles 110. On the other hand, the nonadhesive resin layers 3 are formed by discharging a coating material 107 containing a nonadhesive resin through second discharge nozzles 111. The first and second discharge nozzles 110, 111 are alternately arranged in a row along the width direction of the base material 1, and collectively held with a holder 112 with the tips thereof being directed toward the base material 1.

The coating material (adhesive) 106 and the coating material (nonadhesive resin) 107 are pumped up through hoses 115 by means of a first multiple gear pump 113 and a second multiple gear pump 114, respectively, and fed through other hoses 116 to the discharge nozzles 110, 111, respectively under pressure.

Each of the above multiple gear pumps 113, 114 is comprised of an inlet-side gear pump 117 equipped with two inlet ports 117a and, attached thereto, an arbitrarily number of sequentially connected outlet-side gear pumps each equipped with two outlet ports 118a. A motor 120 is connected to each of the multiple gear pumps 113, 114, whereby the gear pumps 117, 118 of the multiple gear pumps 113, 114 are simultaneously rotated in accordance with the rotation of the motors 120.

Metering pumps manufactured by Slach & Parr, England, may be mentioned as an example of the above multiple gear pump.

A control device, not shown, is connected to each of the motors 120, which controls the rotating speed of each of the motors 120, namely, of the multiple gear pumps 113, 114.

The inlet ports 117a of each of the inlet-side gear pumps 117 are communicated through the hoses 115 with the coating material 106 or 107, and one end of each of the hoses 116 is connected to the outlet port 118a of an outlet-side gear pump 118 while the other end of each of the hoses 116 is connected to each of the discharge nozzles 110, 111. Thus, the coating materials 106, 107 are discharged onto the base material 1 from the tips of the discharge nozzles 110, 111 in accordance with the rotations of the multiple gear pumps 113, 114, respectively.

Thus, the coating material 106, 107 can continuously be applied at a constant discharge pressure by pumping up the coating material 106, 107 by the use of the multiple gear pump 113, 114 and feeding the same through the outlet port 118a to the discharge nozzle 110, 111.

Screw pumps and other displacement-type rotary pumps may also be used in place of the above gear pumps.

If the coating material is foamed during the feed passage from the tank to the discharge nozzle, the foaming will occasionally render it unfeasible to keep the feed pressure of the gear pump constant. In particular, if the foaming occurs in the vicinity of the discharge nozzle, uncoated portions may be formed. A deaerator may be provided in order to avoid the above problems.

The deaerator may be, for example, a device capable of controlling the migration of foams by means of an air filter or ultrasonic vibration and discharging the air outside by means of an air vent valve or the like. The deaerator may be disposed at appropriate point(s) of the hose connecting the tank with the gear pump and/or the hose connecting the gear pump with the discharge nozzle.

The above discharge nozzles 110, 111 each have a tip flatly formed so as to have a major axis in the width direction orthogonal to the feeding direction of the base material 1, and the discharge nozzles are alternately arranged in a row along the width direction of the base material 1 and collectively held with a holder 112 while maintaining the arrangement.

Figure 13:
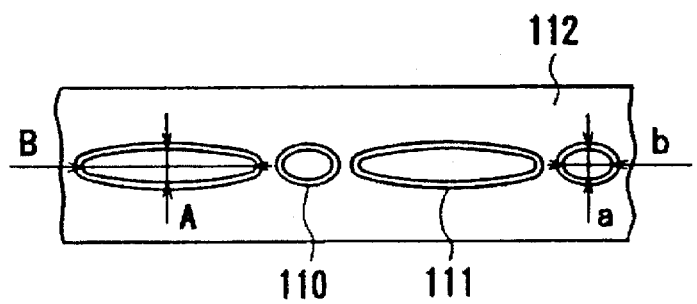
FIG. 13 is an enlarged front view of discharge nozzles.

That is, referring to FIG. 13, the first discharge nozzle 110 may have a major axis b extending along the direction of the width of the adhesive layer 2 which is set at, for example, 1.6 mm in conformity with the extent of the width and a minor axis a orthogonal to the major axis b which is set at, for example, 1 mm to thereby have a flat section (elliptic).

On the other hand, the second discharge nozzle 111 may have a major axis B extending along the direction of the width of the nonadhesive resin layer 3 which is set at, for example, 5.9 mm in conformity with the extent of the width and a minor axis A orthogonal to the major axis B which is set at, for example, the same 1 mm as in the above first discharge nozzle 110 to thereby have a flat section (elliptic).

The discharge nozzles 110, 111 may have not only the above elliptic shape but also a flattened section having upper and lower mutually parallel sides along the width direction.

Consequently, the coating material 106, 107 is discharged onto the base material 1 in the state highly uniformly extended along the direction of the major axes b, B from the tip of the discharge nozzle 110, 111, so that the thickness along the width direction of each of the adhesive layer 2 and the nonadhesive resin layer 3 becomes highly uniform (flat).

The accuracy of the width of each of the adhesive layer 2 and the nonadhesive resin layer 3 can be improved by collectively holding the two types of discharge nozzles 110, 111 with a holder 112 to thereby keep the positional relationship of the discharge nozzles 110, 111 constant.

It has been confirmed that a cover tape for carrier prepared by forming adhesive layers 2 and nonadhesive resin layers 3 each having a thickness of 20 μm on one side of a base material 1 with the use of a 25 μm thick polyethylene terephthalate having one side provided with release treatment as the base material 1, an acrylic adhesive having a concentration of 35% and a viscosity of 1000 cps as the first coating material (adhesive) 106 and a polyester resin having a concentration of 40% and a viscosity of 1500 cps as the second coating material (nonadhesive resin) 107, and then cutting each of the adhesive layers 2 at the center along the width direction thereof with a cutter to thereby obtain tapes each comprising adhesive layers 2 formed on both edges thereof and, sandwiched therebetween, nonadhesive resin layer 3, has a bonding strength of 20, this value falling within the EIAJ standard (10 to 70 g) to thereby show the attainment of stable bonding strength.

Figure 14:
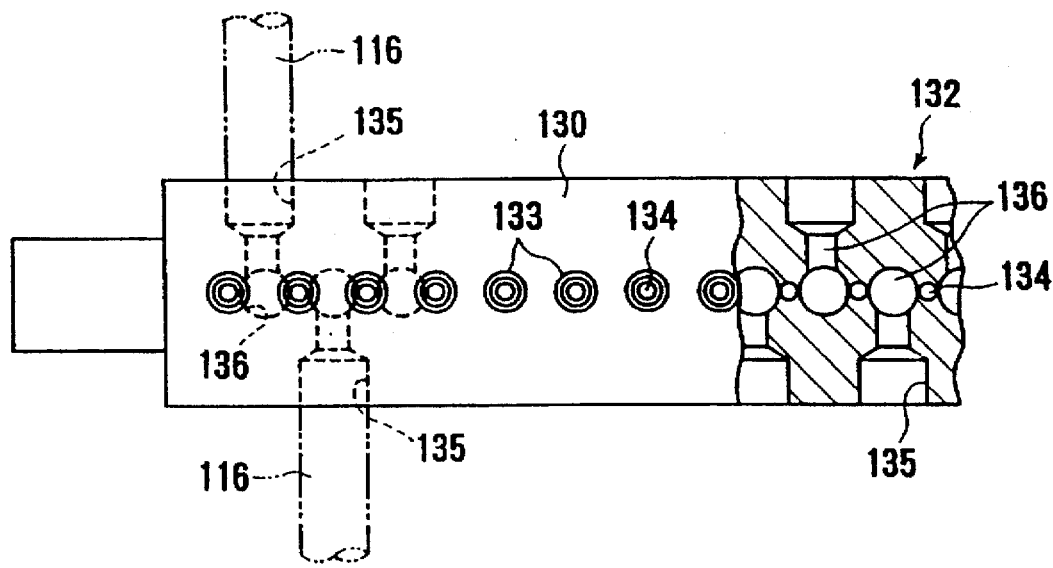
FIG. 14 is a plan of a particular example of arrangement of discharge nozzles.
Figure 15:
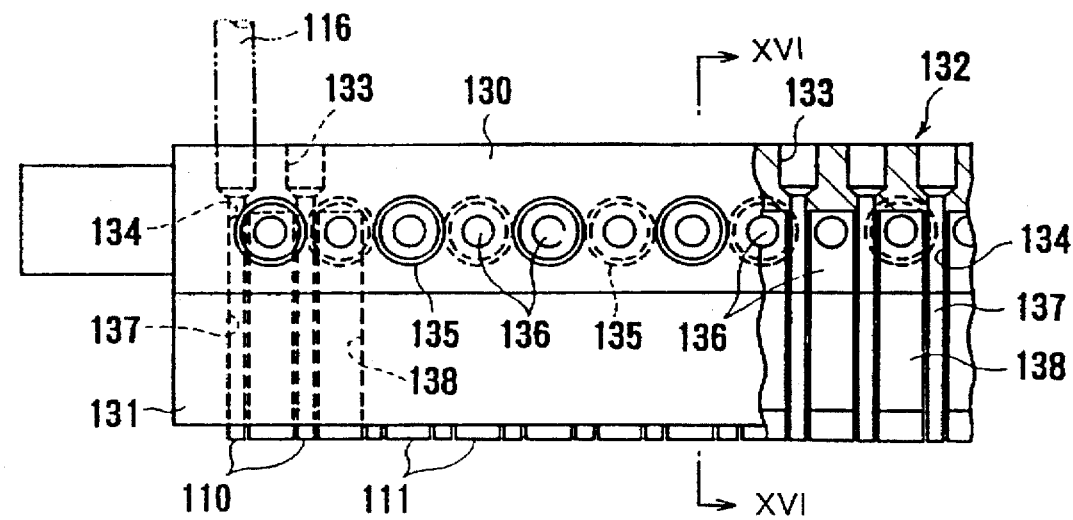
FIG. 15 is a schematic diagram of the above arrangement in its entirety.
Figure 16:
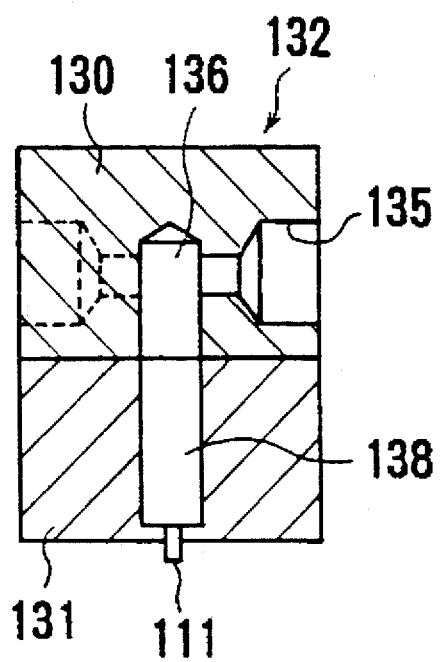
FIG. 16 is a section on the line B—B of FIG. 15.

FIGS. 14 to 16 show one embodiment of the most suitable arrangement at small pitches of the discharge nozzles 110, 111 having the same structure as above.

That is, when the pitch between the discharge nozzles 110, 111 becomes small, it becomes difficult to collectively hold the discharge nozzles 110, 111 in the state of linear arrangement without mutual interference thereof.

In this embodiment, the holder 132 is composed of an upper body 130 and a lower body 131 each having the shape of a square pole. The following flow passages are formed inside the holder 132, and the outlet end of each of the flow passages is provided with the discharge nozzle 110, 111.

Illustratively, in the upper body 130, joints 133 connecting the hoses 116 are formed on the upper part thereof, and first flow passages 134 are provided which vertically extend from the joints 133 downward. Further, the front and rear parts of the upper body 130 are alternately provided with joints 135 connecting the hoses 116, and second flow passages 136 are provided which horizontally extend from the joints 135 and vertically bend downward.

On the other hand, in the lower body 131, first flow passages 137 and second flow passages 138 which vertically extend and communicate with the above first flow passages 134 and second flow passages 136, respectively, when the upper part thereof is bonded with the upper body 130 to thereby form the holder 132, are provided in parallel.

The lower part of the lower body 131 is provided with the first discharge nozzles 110 and second discharge nozzles 111, which communicate with the above first flow passages 137 and second flow passages 138, respectively.

Thus, the holder 132 having the flow passages therein is built by bonding the lower side of the upper body 130 with the upper side of the lower body 131 by means of bolts, not shown.

The resultant structure of the holder ensures compact accommodation of the discharge nozzles 110, 111 at small pitches.

Although the discharge nozzles 110, 111 are arranged in one row and collectively held in the above embodiment, naturally, they may be arranged in two or more rows and collectively held. This is also the same in the following embodiment.

Figure 17:
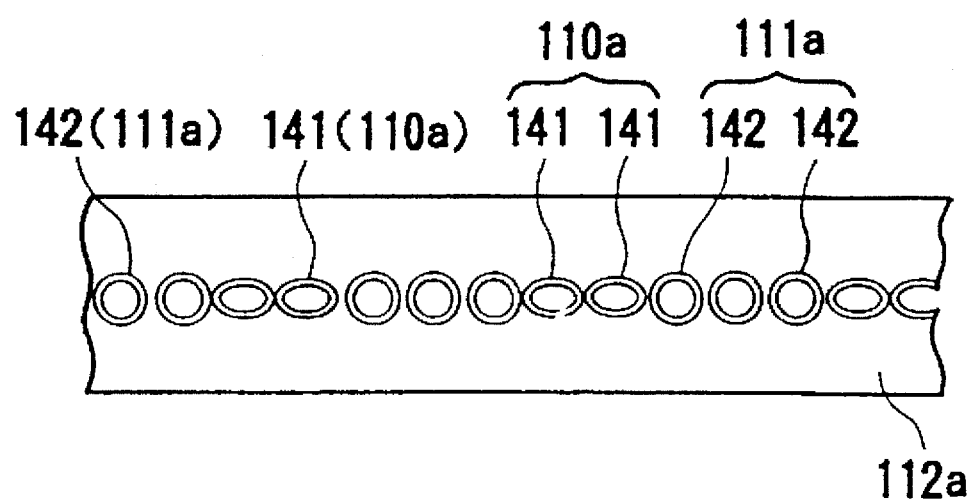
FIG. 17 is a view equivalent to FIG. 13 showing another example.

FIG. 17 shows another embodiment. In this embodiment, two elliptic nozzles 141 each having, for example, a major axis of 1.0 mm and a minor axis of 0.6 mm are arranged in parallel to thereby form a first discharge nozzle 110a for applying a coating material comprising an adhesive. Further, three circular nozzles 142 each having a diameter of, for example, 0.8 mm are arranged in parallel to thereby form a second discharge nozzle 111a for applying a coating material comprising a nonadhesive resin. These discharge nozzles 110a, 111a are collectively held by a holder 112a.

In this embodiment, three rows of nonadhesive resin layers are linearly arranged in parallel in the region sandwiched between neighboring two rows of adhesive layers, and the linear nonadhesive resin layers all have a cross section which is angular with a protrudent center. However, this embodiment is most suitable when the main object resides in uniforming the thickness of the adhesive layer to thereby obtain a stable bonding strength as in the case where the nonadhesive resin layer is provided to ensure stable winding, for example, as in the above cover tape for carrier.

EFFECT OF THE INVENTION

The present invention provides a cover tape employed for collectively packing chips and other small items while keeping them separate from each other to thereby permit the storage, transportation and automatic takeout thereof, which cover tape can be rendered very long.

Moreover, the coating applicator of the present invention, by virtue of the above structure, is capable of not only continuously feeding a coating material to a discharge nozzle by means of a displacement-type rotary pump such as a gear pump while keeping the discharge pressure of the pump more uniform, but also discharging the coating material through the discharge nozzle onto a base material highly uniformly in the state extended along the direction of the width of the base material. Thus, the change of the thickness of the coating film along the width and longitudinal directions of the base material can be prevented to thereby ensure an improved uniformity of the thickness of the coating film.

Still further, for example, when two or more types of coating materials are separately applied on one side of a base material, the dimensional accuracy of the coating film along the width direction of the base material can be improved by arranging a plurality of discharge nozzles in a single row along the direction of the width of the base material and collectively holding them while maintaining the arrangement to thereby perpetually keep the interdischarge-nozzle spacing constant.

EXAMPLES

The present invention will now be illustrated in greater detail with reference to the following Examples, which should not be construed as limiting the present invention.

In the following Examples and Comparative Examples, the winding test (Test 1) and the accelerated mount storage test (Test 2) were carried out in the following manners.

Winding Test (Test 1)

A cover tape (9.3 mm width) was wound until having a length of 2000 m, and the winding condition was visually checked. In the table, "good" means that no winding failure occurred, and "bad" means that winding failure occurred, so that winding to a length of 200 m or more was unfeasible.

Accelerated Mount Storage Test (Test 2)

The cover tape (9.3 mm width) was adhered to a carrier tape having various parts accommodated therein. The resultant specimen was stored at 70° C. for 2000 hrs, and thereafter the degree of the sticking of the parts to the tape was examined. In the table, "good" means that there was no sticking of the parts, "possible" means that the nonadhesive layer was broken to thereby cause parts to stick to the adhesive layer when use was made of parts having acute protrusions (shape of needle tip), and "bad" means that a large volume of parts stuck to the cover tape.

Example 1

A polyester film having a thickness of 25 μm and a width of 9.3 mm was used as a base material.

The center portion (except both 1 mm edges) of the base material was coated with a polyester resin so as to form a nonadhesive resin layer having a width of 7.3 mm and a thickness of 25 μm, and simultaneously both the edges of the base material with an acrylic pressure-sensitive adhesive so as to form adhesive layers each having a width of 1 mm and a thickness of 25 μm, by the use of the coating applicator of the present invention. Thus, a cover tape according to the present invention was obtained.

The thus obtained cover tape was subjected to the above tests, and the results are shown in Table 1.

Example 2

The center portion (except both 1 mm edges) of a polyester film having a thickness of 25 μm and a width of 9.3 mm was coated with a polyester resin by means of a gravure coater so as to form a nonadhesive resin layer having a width of 7.3 mm and a thickness of 25 μm. Then, both the edges of the film were coated with a pressure-sensitive adhesive (acrylic pressure-sensitive adhesive) by means of a knife coater so as to form adhesive layers each having a width of 1 mm and a thickness of 25 μm. Thus, a cover tape according to the present invention was obtained.

The thus obtained cover tape was subjected to the above tests, and the results are shown in Table 1.

Comparative Example 1

Figure 18:
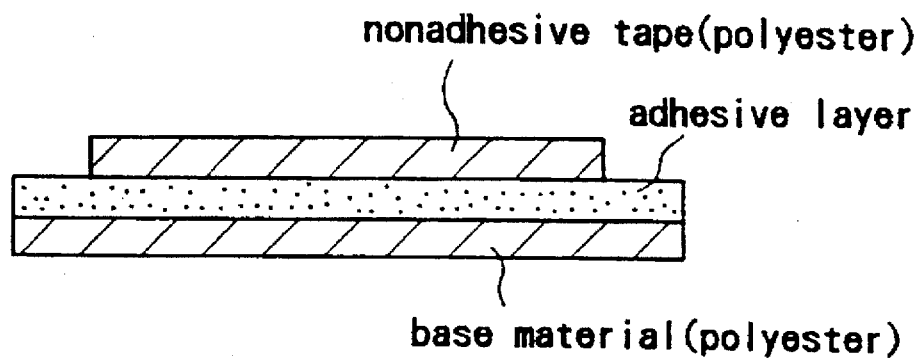
FIG. 18 is a sectional view of a cover tape of the prior art (Comparative Example 1)

A 25 μm thick adhesive layer was formed over the entire surface (one side) of the same polyester film as in Example 1, and a polyester film having a thickness of 25 μm and a width of 7.3 mm was stuck on the adhesive layer in a manner such that both 1 mm side edges of the adhesive layer were left uncovered. Thus, a cover tape having the structure shown in FIG. 18 was prepared.

The thus prepared cover tape was subjected to the above tests, and the results are shown in Table 1.

Comparative Example 2

Figure 19:
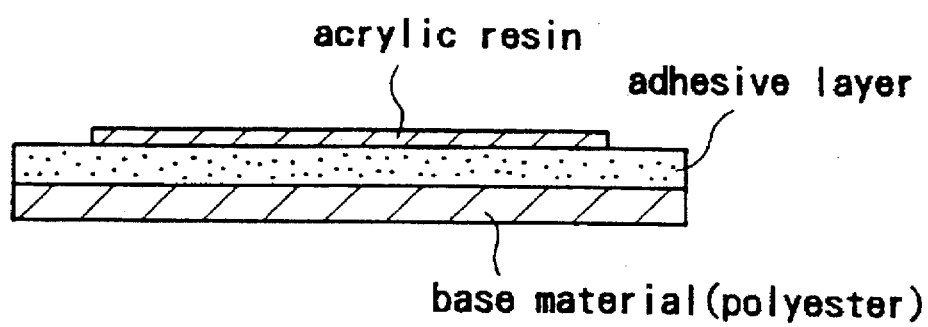
FIG. 19 is a sectional view of another cover tape of the prior art (Comparative Example 2)

After the formation of the adhesive layer in the same manner as in Comparative Example 1, a UV-curable acrylic resin was coated by a gravure coater and irradiated with UV to thereby form a nonadhesive layer having a thickness of 5 μm and a width of 7.3 mm. Thus, a cover tape having the structure shown in FIG. 19 was prepared.

The thus prepared cover tape was subjected to the above tests, and the results are shown in Table 1.

Comparative Example 3

A 25 μm thick hot melt adhesive (composed of synthetic rubber) was coated by a die coater onto the entire surface (one side) of the same polyester film as in Example 1, thereby preparing a cover tape.

The thus prepared cover tape was subjected to the above tests, and the results are shown in Table 1.

Comparative Example 4

Figure 20:
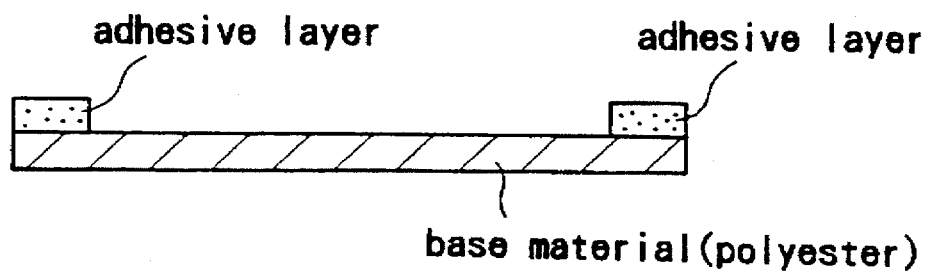
FIG. 20 is a sectional view of still another cover tape of the prior art.

Only adhesive layers were applied on both the edges of the polyester film in the same manner as in Example 2, thereby preparing a cover tape having the structure shown in FIG. 20.

The thus prepared cover tape was subjected to the above tests, and the results are shown in Table 1.

TABLE 1

|  | Example 1 | Example 2 | Compar. Ex. 1 | Compar. Ex. 2 | Compar. Ex. 3 | Compar. Ex. 4 |
| --- | --- | --- | --- | --- | --- | --- |
| Test (1) | good | good | bad | good | good | bad |
| Test (2) | good | good | good | possible | bad | good |

What is claimed is:

1. A cover tape to be adhered to a surface of a carrier tape having a tape shape and having accommodation parts for accommodating chips and other small items formed discontinuously along the longitudinal direction of the carrier tape to thereby seal the accommodation parts, the cover tape comprising:

a base material having edges;

adhesive parts formed on one side of the base material adjacent both edges of the base material and extending along a longitudinal direction of the base material, wherein the adhesive parts are configured to oppose none of the accommodation parts; and a nonadhesive resin part formed on the one side of the base material between the adhesive parts and having substantially the same thickness as the adhesive parts, wherein the nonadhesive resin part is configured to oppose the accommodation parts.

2. A cover tape for a carrier assembly for the packing, storage, transportation and automatic takeout of a plurality of parts while keeping the parts unsoiled and separate from each other, the carrier assembly including a carrier tape having a plurality of recesses or through-holes for retaining the parts separate from each other, wherein the carrier tape and the cover tape cooperate to retain the parts therebetween, said cover tape comprising:

a) a base material having edges;

b) a pair of substantially parallel spaced apart adhesive layers formed on one surface of said base material and extending along the longitudinal axis of said one surface of said base material at both edges of said base material, said adhesive layers adapted to contact a pair of receiving surfaces extending along the longitudinal axis of the carrier tape when said cover tape is placed over the carrier tape and wherein neither of said adhesive layers is disposed above the parts when said cover tape is placed over the carrier tape; and c) a nonadhesive layer formed on said one surface of said base material, said nonadhesive layer located in a space formed between said spaced apart adhesive layers, and wherein said nonadhesive layer is disposed over the parts when said cover tape is placed over the carrier tape, wherein said nonadhesive layer has substantially the same thickness as that of said adhesive layers and prevents the parts from contacting said adhesive layers.

3. The cover tape of claim 2 wherein said adhesive layers achieve adhesion by means other than the application of heat.

4. The cover tape of claim 2 wherein at least one element of said adhesive layers and said nonadhesive layer further comprises a colorant to color said adhesive.

5. The cover tape of claim 4 wherein said colorant is selected from the group consisting of carbon black, organic pigments, inorganic pigments, organic dyes and leuco dyes.

6. The cover tape of claim 4 wherein said colorant is added to an adhesive of said adhesive layers in an amount of 0.1 to 100 parts by weight per 100 parts by weight of said adhesive.

7. The cover tape of claim 2 wherein said adhesive layers further comprise an adhesive selected from the group consisting of acrylic, rubber and silicon adhesives.

8. The cover tape of claim 2 wherein said nonadhesive layer further comprises at least one nonadhesive resin selected from the group consisting of nonadhesive polyester resins, acrylic resins, urethane resins, natural rubbers, styrene rubbers, isoprene rubbers, urethane rubbers, silicone rubbers, styrene foams, urethane foams and asphalt.

9. The cover tape of claim 2 wherein said nonadhesive layer covers only a portion of said space between said spaced apart adhesive layers.

10. The cover tape of claim 2 wherein said adhesive layers and said nonadhesive layer are uniform in height along both the longitudinal axis of said base material and along the width of said base material.

11. The cover tape of claim 2 wherein the thickness of said nonadhesive layer and said adhesive layers are within a degree of uniformity of 100±20(%) of a value determined by the formula:

$$\frac{(a+b)}{(a+c)} \times 100(\%)$$

wherein a is the thickness of the base material, b is the thickness of each of said adhesive layers, respectively, and c is the thickness of the nonadhesive layer.

12. The cover tape of claim 2 wherein said cover tape has a bond strength greater than 20 g.

13. The cover tape of claim 2 wherein said base material is transparent.

14. The cover tape of claim 2 wherein said base material is composed of a synthetic resin selected from the group consisting of polyethylene terephthalate, oriented polypropylene, oriented polyamides, oriented polyvinyl chloride, polystyrene, polycarbonate, polyethylene and polyacrylonitrile.

15. The cover tape of claim 2 wherein said base material has a thickness of 6 to 200 µm.

16. The cover tape of claim 2 wherein at least one element selected from the group consisting of said base material and said nonadhesive layer includes an antistatic agent to prevent damaging of electronic components by static electricity.

17. The cover tape of claim 16 wherein said antistatic agent is selected from the group consisting of carbon, metals and cationic, anionic and nonionic antistatic agents.

18. The cover tape of claim 2 wherein said cover tape further comprises a release layer wherein said release layer is composed of a resin selected from the group consisting of silicone, fluorinated alkyl resins and long-chain alkyl resins.

19. The cover tape of claim 18 wherein said release layer further comprises an antistatic agent.

20. A carrier assembly for the packing, storage, transportation and automatic takeout of a plurality of parts while keeping the parts unsoiled and separate from each other, said carrier assembly including a carrier tape having a plurality of recesses or through-holes for retaining the parts separate from each other, wherein the carrier tape and the cover tape cooperate to retain the parts therebetween, said carrier assembly comprising:

a) a carrier tape, said carrier tape including a pair of substantially parallel spaced apart receiving surfaces extending longitudinally along both edges of said carrier tape for receiving a cover tape, said carrier tape further including a means for retaining the parts separate and apart from each other on said carrier tape; and b) a cover tape, said cover tape being adhered with an adhesive to said cover tape receiving surfaces of said carrier tape, said cover tape and said carrier tape cooperating to retain the parts on said carrier tape without exposing the parts to said adhesive, said cover tape further including:

i) a base material having edges;

ii) a pair of substantially parallel spaced apart adhesive layers formed on one surface of said base material and extending along the longitudinal axis of said base material at both edges of said base material, said adhesive layers adapted to contact said pair of cover tape receiving surfaces of said carrier tape when said cover tape is placed over said carrier tape and wherein neither of said adhesive layers is disposed above the parts when said cover tape is placed over said carrier tape; and iii) a nonadhesive layer formed on said base material, said nonadhesive layer located in a space formed between said spaced apart adhesive layers, wherein said nonadhesive layer is disposed over the parts when said cover tape is placed over said carrier tape, wherein said nonadhesive layer has substantially the same thickness as that of said adhesive layers and prevents the parts from contacting said adhesive layers.

21. The carrier assembly of claim 20 wherein said means for retaining the parts separate and apart from each other includes a plurality of through-holes wherein each of said through holes retains at least one of the parts.

22. The carrier assembly of claim 20 wherein said carrier tape is a strip of plastic tape and wherein said means for retaining the parts separate and apart from each other includes a plurality of recessed portions wherein each of said recessed portions retains at least one of the parts.

* * * * *

UNITED STATES PATENT AND TRADEMARK OFFICE
CERTIFICATE OF CORRECTION

PATENT NO.  : 5,691,038
DATED       : November 25, 1997
INVENTOR(S) : Akira Hirata et al.

It is certified that error appears in the above-identified patent and that said Letters Patent is hereby corrected as shown below:

Column 4 Line 21 between "oppose" and "none" delete --to--.

Column 4 Line 23 "opposing to" should read --opposite--.

Column 6 Line 38 after "opposite" delete --to--.

Signed and Sealed this

Thirty-first Day of March, 1998

Attest:

BRUCE LEHMAN

Attesting Officer

Commissioner of Patents and Trademarks